United States Patent
Cheng et al.

(10) Patent No.: US 7,525,177 B2
(45) Date of Patent: Apr. 28, 2009

(54) CONTROLLABLE VARACTOR WITHIN DUMMY SUBSTRATE PATTERN

(75) Inventors: Chung-Long Cheng, Hsin-Chu (TW); Kong-Beng Thei, Hsin-Chu (TW); Sheng-Yuan Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 419 days.

(21) Appl. No.: 11/097,743

(22) Filed: Apr. 1, 2005

(65) Prior Publication Data

US 2006/0220181 A1    Oct. 5, 2006

(51) Int. Cl.
*H01L 29/93* (2006.01)
(52) U.S. Cl. .................. 257/595; 257/E29.344
(58) Field of Classification Search .......... 438/379; 257/595, E29.344
See application file for complete search history.

(56) References Cited

U.S. PATENT DOCUMENTS

| | | | |
|---|---|---|---|
| 6,600,199 B2 * | 7/2003 | Voldman et al. | 257/370 |
| 6,642,607 B2 * | 11/2003 | Ohnishi et al. | 257/595 |
| 2002/0074589 A1 * | 6/2002 | Benaissa et al. | 257/312 |
| 2006/0145300 A1 * | 7/2006 | Coolbaugh et al. | 257/595 |

* cited by examiner

*Primary Examiner*—W. David Coleman
(74) *Attorney, Agent, or Firm*—Thomas, Kayden, Horstemeyer & Risley

(57) ABSTRACT

A dummy region varactor for improving a CMP process and improving electrical isolation from active areas and a method for forming the same, the varactor including a semiconductor substrate having a dummy region said dummy region including a first well region having a first polarity; shallow trench isolation (STI) structures disposed in the dummy region defining adjacent mesa regions comprising first, second, and third mesa regions; a second well region having a second polarity underlying the first mesa region having the second polarity to form a PN junction interface; wherein said second and third mesa regions having the first polarity are formed adjacent either side of said first mesa region.

12 Claims, 3 Drawing Sheets

US 7,525,177 B2

CONTROLLABLE VARACTOR WITHIN DUMMY SUBSTRATE PATTERN

FIELD OF THE INVENTION

This invention generally relates to integrated circuit device manufacturing and more particularly to dummy substrate patterns for improving CMP processes including formation of an adjustable varactor formed within the dummy pattern for use in logic and mixed signal applications.

BACKGROUND OF THE INVENTION

During STI formation, CMP of an overlying STI oxide layer in the formation of STI structures generally leads to dishing or preferential polishing of the upper portion of the STI structure in relation to surrounding surfaces.

In addition, in logic and mixed signal operations, device elements such as resistors are formed in an active device area. Prior art methods have proposed forming dummy areas surrounding active areas to avoid dishing effects in CMP processes to form STI structures as well as improve the uniformity in polysilicon e.g., gate electrode etching processes.

However, a problem in the prior art is that the formation of dummy patterns has been found to undesirably affect the electrical performance of devices formed in the active areas by parasitic coupling phenomena.

There is therefore a need in the semiconductor device integrated circuit manufacturing art to develop an improved method to form dummy patterns to avoid active device performance degradation.

It is therefore an object of the invention to provide an improved method to form dummy patterns to avoid active device performance degradation, while overcoming other deficiencies and shortcomings of the prior art.

SUMMARY OF THE INVENTION

To achieve the foregoing and other objects, and in accordance with the purposes of the present invention, as embodied and broadly described herein, the present invention provides a dummy region varactor for improving a CMP process and improving electrical isolation from active areas and a method for forming the same.

In a first embodiment, the varactor includes a semiconductor substrate having a dummy region said dummy region including a first well region having a first polarity; shallow trench isolation (STI) structures disposed in the dummy region defining adjacent mesa regions comprising first, second, and third mesa regions; a second well region having a second polarity underlying the first mesa region having the second polarity to form a PN junction interface; wherein said second and third mesa regions having the first polarity are formed adjacent either side of said first mesa region.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to formation of an exemplary dummy substrate pattern it will be appreciated that the spacing of the dummy pattern, e.g., dummy shallow trench isolation (STI) isolation regions, may be varied as required to provide an appropriate pattern density to improve a CMP polishing process of active regions, for example avoiding a dishing effect when forming STI isolation regions in active regions. It will also be appreciated that dummy regions including the dummy STI structures and intervening mesa structures may be placed surrounding or adjacent active regions including conventional semiconductor devices including logic devices and mixed signal (digital/analog) devices.

Figure 1A:
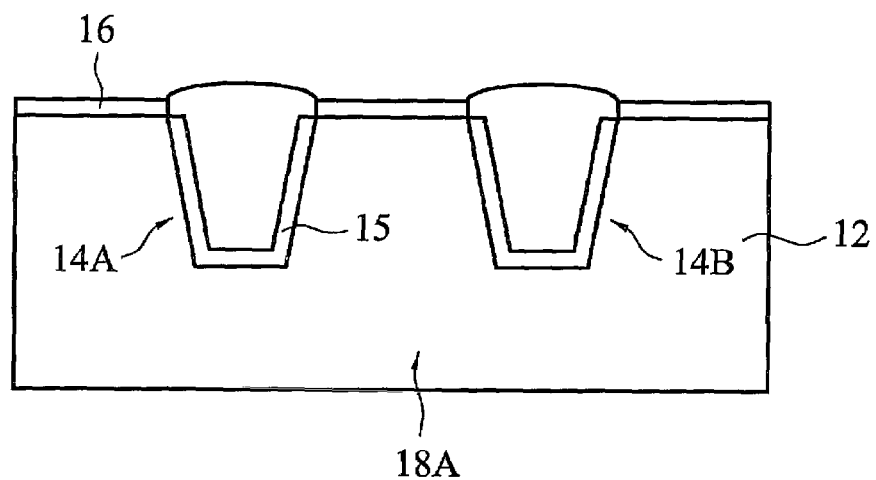
FIGS. 1A-1D are representative cross sectional views at stages in a manufacturing a semiconductor device according to an embodiment of the present invention.

Referring to FIG. 1A, is shown a dummy region portion of semiconductor substrate 12. For example, the substrate 12 may include, but is not limited to, silicon, silicon on insulator (SOI), stacked SOI (SSOI), stacked SiGe on insulator (S—SiGeOI), SiGeOI, and GeOI, and combinations thereof. It will be appreciated that the semiconducting substrate may be formed to have buried channel regions. In a preferred embodiment, the semiconductor substrate is formed of silicon preferably with a buried P-type epitaxial silicon region.

Still referring to FIG. 1A, shallow trench isolation (STI) structures 14A, 14B are formed by conventional processes in the dummy region of the semiconductor substrate 12 and may be formed in parallel with STI structures in active regions including active devices. For example, a pad oxide layer (not shown) is first formed over the substrate 12, followed by formation of a hardmask nitride layer (not shown) such as silicon nitride and/or silicon oxynitride, followed by formation of a patterned resist layer (not shown) for etching the STI structures, followed by a dry (plasma) etching process to etch STI openings in the semiconductor substrate 12. The STI openings are then backfilled with a non-conducting material such as TEOS oxide or another silicon oxide material referred to as STI oxide deposited by HDP-CVD, LPCVD or PECVD processes. Prior to backfilling with silicon oxide, the openings may optionally be lined with dielectric liners e.g., 15, such as $SiO_2$, SiN, SiON, or combinations thereof. A reverse mask process may then first be carried out to back etch (remove) a portion of the excess deposited STI oxide followed by an STI oxide CMP process to stop on the hardmask layer. The hardmask layer and pad oxide layers are then removed by conventional wet etch process (e.g., $H_3PO_4$ for the hardmask and HF for the pad oxide) followed by growth of a sacrificial silicon oxide layer e.g., 16 over the semiconductor substrate 12 surface.

Still referring to FIG. 1A, a conventional deep N-well ion implant process is then carried out to form an N-well region 18A (boundaries not shown) in the substrate 12. For example, the wafer process surface is masked forming a patterned resist layer (not shown) to selectively form N-well regions in the substrate under selectively exposed regions including the entire dummy region portion of substrate 12 as shown.

Figure 1B:
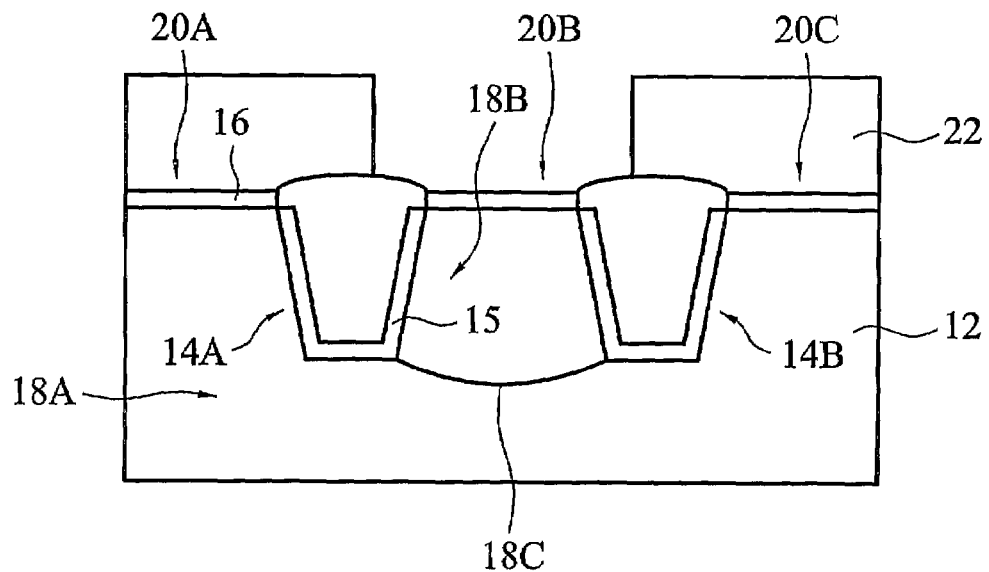

Referring to FIG. 1B, in an important aspect of the invention a P-well region 18B, according to a second ion implant process is formed underlying a mesa region 20B defined by STI structures 14A and 14B on either side forming a PN junction region e.g., having an interface boundary approximated by line 18C separating deep N-well region 18A and p-well region (reverse well) 18B. For example, patterned photoresist layer 22 is formed to expose mesa region 20B and substantially cover adjacent STI structures e.g., 14A and 14B as well as adjacent mesa regions e.g., 20A and 20C. A conventional P-type dopant is then implanted by a conventional ion implant process to form a P-well region 18B having a lower boundary approximated by line 18C.

Following formation of the P-well region 18B, preferably, in an important aspect of the invention, a subsequent additional N type ion implant process (e.g., N+ implant) is carried out selectively (e.g., using a patterned resist layer) over mesa regions 20A and 20C and an additional P type ion implant (e.g., P+ implant) carried out selectively over the mesa region 20B to achieve a desired dopant level in the regions underling the respective mesa regions 20A, 20B, and 20C defined by STI structures e.g., 14A and 14B. Following ion implantation, a conventional drive in process such as a rapid thermal anneal (RTA) is then carried out to better define the doped regions. It will be appreciated that one or more of the respective ion implant processes may be carried out in parallel with formation of device in active regions including logic and/or analog devices.

It will be appreciated that a sheet resistance ($R_{sh}$) exists in the substrate N-well region 18A between mesa regions 20A and 20C. For example it has been found that an N-well $R_{sh}$ component within dummy regions has a parasitic coupling effect, e.g., creating parallel capacitances and/or resistances with adjacent active device regions (not shown) degrading device performance. For example, it has been found that an $R_{sh}$ component in N-well active region portions adjacent the dummy regions e.g., 18A can be shifted to a lower series resistance value by such parasitic coupling effects, for example shifting the effective series resistance of a resistor component to a lower value by up to about 100%. It will be appreciated that an adjacent active device in an active region may have substantially the same structure as that shown in the dummy region portion without the reverse well P-doped region e.g., 18B, for example to form a resistor element including supplying electrical Voltage signals to mesa regions separated by STI structures.

According to an aspect of the invention, the dummy well region e.g., deep N-well region 18A, formed with an embedded reverse well region, e.g., embedded P-well region 18B, advantageously creates a PN junction interface, approximated by line 18C, that serves to isolate and reduce parasitic coupling effects of the dummy region 18A. It will be appreciated that a reverse N-well region may also be created (embedded) within a deep P-well region by similar processes outlined above, but reversing the polarity (e.g., N type or P type) of the respective implant processes.

Figure 1C:
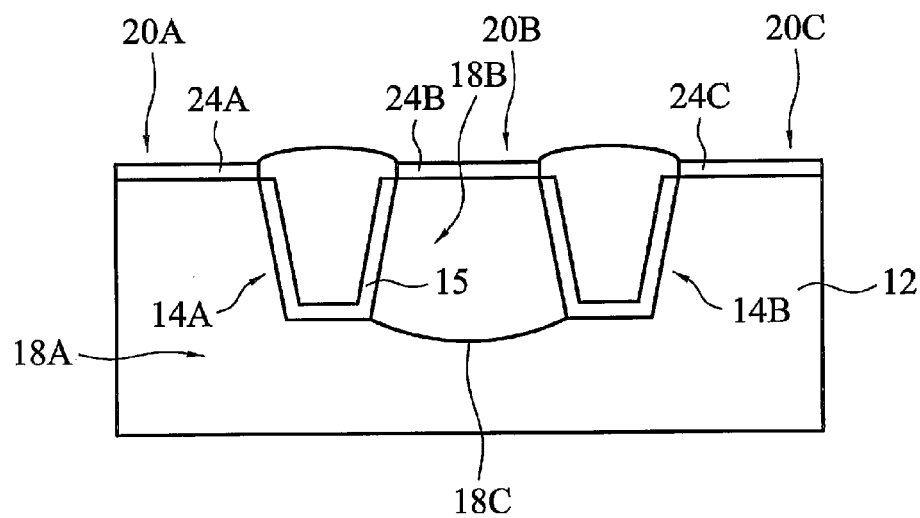

Referring to FIG. 1C, in another important aspect of the invention, after removing the sacrificial silicon oxide layer 16 shown in FIG. 1B, a conventional self aligned silicide (salicide) formation process is carried out to form metal silicide regions e.g., 24A, 24B, and 24C on the upper portion of the mesa regions 20A, 20B, and 20C. For example, the metal silicide may be formed of titanium silicide, cobalt silicide, nickel silicide, tungsten silicide, platinum silicide, and the like, most preferably $TiSi_2$, $CoSi_2$, or NiSi.

Figure 1D:
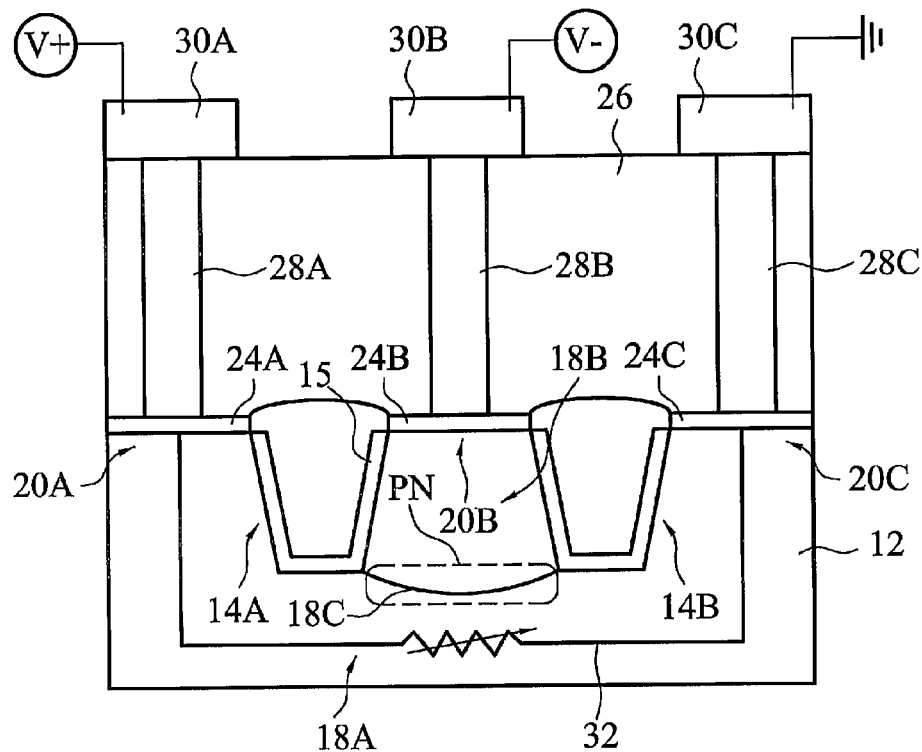

Referring to FIG. 1D, via and metal interconnect lines are then formed by conventional processes to form an adjustable varactor device. For example, one or more a dielectric insulating layers also referred to as an inter-layer dielectric (ILD) e.g., 26 is formed followed by forming contact vias e.g., 28A, 28B, and 28C in electrical communication with salicide contact regions e.g., e.g., 24A, 24B, and 24C. Interconnect lines (electrodes) e.g., 30A, 30B, and 30C are then be formed in communication with the contacts vias by conventional processes, e.g., either a damascene process or metal line etching process.

Advantageously, in an important aspect of the invention, Voltage signals (e.g., V+, V−) may advantageously be supplied to the mesa regions 20A, 20B, and 20C to selectively control the size of the PN junction depletion region, approximated by dashed line PN around PN junction boundary line 18C, to form a varactor to produce a variable N-well 18A $R_{sh}$ element, approximated by equivalent variable resistor circuit 32 passing a signal through N-well region 18A.

For example, by varying N-well $R_{sh}$, the parasitic coupling effect with active region devices may be reduced or avoided as well as forming a varactor device, while still retaining the benefits of the dummy region for improving CMP process planarity in the STI oxide planarizing process. By supplying different levels of Voltages to the various salicide contact regions, a controllable/adjustable varactor may advantageously be formed. For example, mesa region 20A may be supplied with a positive Voltage signal (V+) with mesa region 20C at relative electrical ground, while mesa region 20B including the underlying PN junction region PN, is supplied with a relatively negative Voltage (V−).

Thus a device and method of forming the same has been presented. The advantages of forming a dummy region according to preferred embodiments is realized by improving CMP polishing of active device regions to avoid a dishing effect. In addition, by forming a reverse well region according to preferred embodiments, parasitic coupling effects to adjacent active areas is reduced or avoided, allowing more flexible placement of dummy regions to further improve CMP polishing of active regions as well as improving etching processes over active regions. Moreover, the dummy region with an embedded reverse well region formed according to preferred embodiments may advantageously function as an adjustable varactor by supplying appropriate metal interconnects and Voltage signals to adjust the depletion region of the PN junction.

Figure 2:
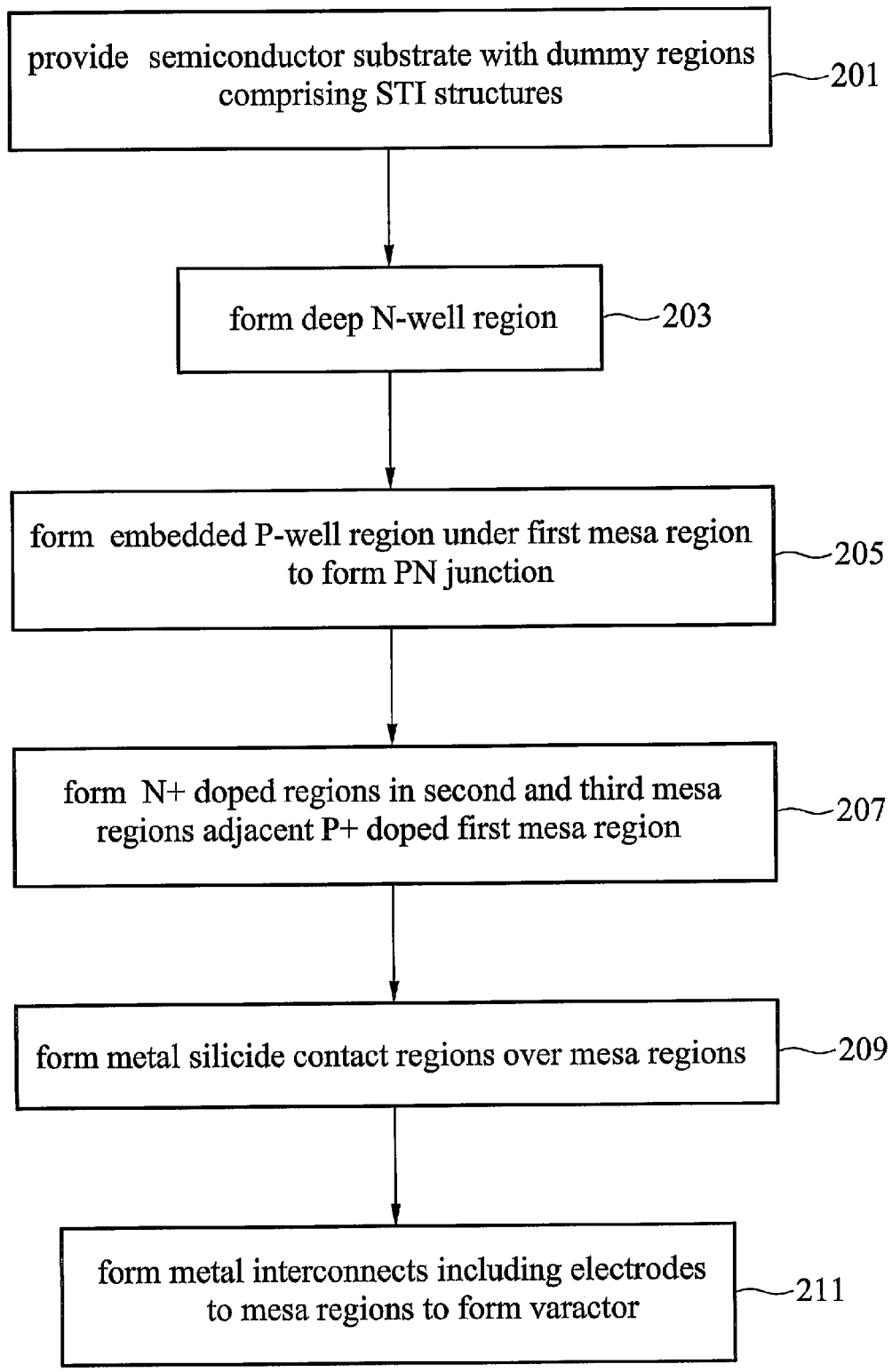
FIG. 2 is a process flow diagram including several embodiments of the present invention.

Referring to FIG. 2 is a process flow diagram including several embodiments of the present invention. In process 201, a semiconductor substrate dummy region is provided including STI structures defining dummy mesa regions adjacent active regions. In process 203, a deep well region (e.g., N-well) is formed in the dummy region. In process 205, an embedded well region (reverse well region) of opposite polarity (e.g., P-well) is formed within the deep well region to form a PN junction region under a first dummy mesa region (e.g., between N-doped dummy mesa regions). In process 207, dummy mesa regions are ion implanted (doped) with respective P type and N type dopants to form N+ and P+ dummy mesa regions, e.g., second and third N+ doped mesa regions adjacent P+ doped first mesa region. In process 209, metal silicide contact regions are formed on the dummy mesa regions. In process 211 metal interconnects including electrodes are formed to the contact regions to provide adjustable Voltage signals to form a varactor.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. An integrated circuit device comprising:
   a semiconductor substrate;
   a first shallow trench isolation (STI) structure separates a first dummy mesa region and a second dummy mesa region in the semiconductor substrate;

a second shallow trench isolation (STI) structure separates the first dummy mesa region and a third dummy mesa region in the semiconductor substrate, wherein the second and third dummy mesa regions have opposite polarity to the first dummy mesa region; and a well region having opposite polarity to the first dummy mesa region underlying the first dummy mesa region to form a PN junction interface.

2. The integrated circuit device of claim 1, wherein the first dummy mesa region is P type.

3. The integrated circuit device of claim 1, further comprising electrical interconnects to carry a voltage signal, said electrical interconnects electrically connected to the respective first dummy mesa region, second dummy mesa region and third dummy mesa region to form a varactor.

4. The integrated circuit device of claim 1, further comprising electrical interconnects to supply a first polarity voltage signal across the first and third dummy mesa regions and a second polarity voltage signal to the first dummy mesa region to adjust a depletion region comprising the PN junction interface.

5. The integrated circuit device of claim 1, wherein each of the first dummy mesa region, the second dummy mesa region and the third dummy mesa region comprises an upper portion formed of metal silicide.

6. The integrated circuit device of claim 1, wherein an upper portion of the first mesa region has a relatively higher level of P doping compared to the well region at the PN junction interface.

7. The integrated circuit device of claim 1, wherein the second and third mesa regions have a relatively higher level of N doping compared to a another well region below the well region.

8. The integrated circuit device of claim 1, wherein at leaser one of the first shallow trench isolation and the second shallow trench isolation comprises a liner material selected from the group consisting of SiO2, SiN, and SiON.

9. The integrated circuit device of claim 1, wherein at leaser one of the first shallow trench isolation and the second shallow trench isolation comprises a silicon oxide filling having an upper planarized surface.

10. The integrated circuit device of claim 1, wherein the semiconductor substrate comprises material selected from the group consisting of silicon, silicon on insulator, SiGe, SiGe on insulator, and combinations thereof.

11. The integrated circuit device of claim 2, wherein the second dummy mesa region, the third dummy mesa region and the well region is N type.

12. The integrated circuit device of claim 5, wherein the metal silicide is selected from the group consisting of titanium silicide, cobalt silicide, nickel silicide, platinum silicide, and tungsten silicide.

* * * * *